United States Patent
Ishikawa et al.

(10) Patent No.: US 9,207,262 B2
(45) Date of Patent: Dec. 8, 2015

(54) VOLTAGE DETECTION DEVICE

(71) Applicant: YAZAKI CORPORATION, Tokyo (JP)

(72) Inventors: Satoshi Ishikawa, Makinohara (JP);
Masashi Sekizaki, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 301 days.

(21) Appl. No.: 13/860,576

(22) Filed: Apr. 11, 2013

(65) Prior Publication Data
US 2013/0229169 A1 Sep. 5, 2013

Related U.S. Application Data

(63) Continuation of application No. PCT/JP2011/005017, filed on Sep. 7, 2011.

(30) Foreign Application Priority Data

Oct. 15, 2010 (JP) .................................. 2010-232327

(51) Int. Cl.
*G01R 1/30* (2006.01)
*G01R 31/36* (2006.01)
*H01M 10/48* (2006.01)

(52) U.S. Cl.
CPC ................ *G01R 1/30* (2013.01); *G01R 31/362* (2013.01); *G01R 31/3658* (2013.01); *H01M 10/482* (2013.01)

(58) Field of Classification Search
CPC .................... G01R 31/3658; G01R 19/16542; H01M 10/482
See application file for complete search history.

(56) References Cited

U.S. PATENT DOCUMENTS

| | | | |
|---|---|---|---|
| 6,404,166 B1 | 6/2002 | Puchianu | |
| 2005/0077878 A1* | 4/2005 | Carrier | ...................... B25F 5/00 320/134 |

(Continued)

FOREIGN PATENT DOCUMENTS

| | | |
|---|---|---|
| CN | 1319189 A | 10/2001 |
| JP | 2002-521792 A | 7/2002 |

(Continued)

OTHER PUBLICATIONS

The Japanese official action issued on Sep. 16, 2014 in the counterpart Japan patent application. (Partial English translation also submitted.).
Chinese office action issued on Sep. 29, 2014.

*Primary Examiner* — Tung X Nguyen
*Assistant Examiner* — Adam Clarke
(74) *Attorney, Agent, or Firm* — Marvin A. Motsenbocker; Mots Law, PLLC

(57) ABSTRACT

A voltage detection device includes: a plurality of voltage-detecting ICs installed in order to detect voltages of a plurality of blocks of a secondary battery, each of the voltage-detecting ICs being installed for each of the blocks; and an interruption control unit that controls interruption operations of the voltage-detecting ICs. After resetting all of the voltage-detecting ICs by transmitting a trigger signal to all of the voltage detecting ICs, the interruption control unit transmits a control signal in which an address of a voltage-detecting IC allowed to execute an interruption operation is designated. Each of the voltage-detecting ICs receives the control signal within a designated time set in advance, executes the interruption operation when an address of its own is designated, and is left reset when the address of its own is not designated.

4 Claims, 3 Drawing Sheets

(56) References Cited

U.S. PATENT DOCUMENTS

| | | |
|---|---|---|
| 2009/0164154 A1 | 6/2009 | Ishikawa et al. |
| 2009/0316320 A1* | 12/2009 | Maeda et al. ............... 361/92 |
| 2010/0060256 A1 | 3/2010 | Ishikawa et al. |
| 2010/0188092 A1 | 7/2010 | Sekizaki et al. |

FOREIGN PATENT DOCUMENTS

| | | |
|---|---|---|
| JP | 2009-17657 A | 1/2009 |
| JP | 2009-156633 A | 7/2009 |
| JP | 2010-066039 A | 3/2010 |
| JP | 2010-200601 A | 9/2010 |

* cited by examiner

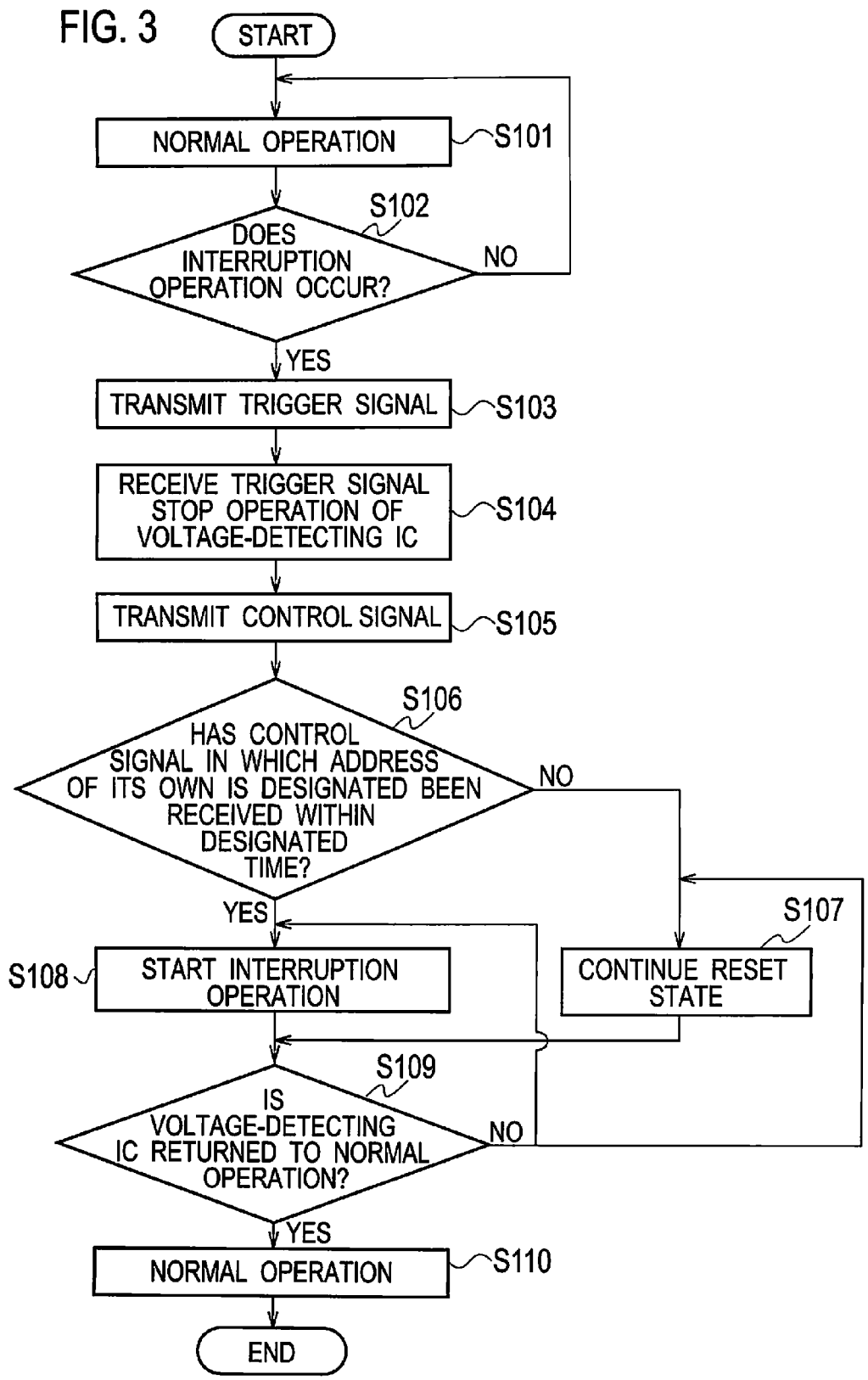

VOLTAGE DETECTION DEVICE

This application is a continuation of International Application No. PCT/JP2011/005017, filed Sep. 7, 2011, and based upon and claims the benefit of priority from Japanese Patent Application No. 2010-232327, filed Oct. 15, 2010, the entire contents of all of which are incorporated herein by reference.

TECHNICAL FIELD

The present invention relates to a voltage detection device that detects a voltage of a secondary battery composed by connecting a plurality of unit cells in series to one another.

BACKGROUND ART

Heretofore, for example, in a hybrid vehicle, a high-voltage battery has been provided as a drive power supply of a motor. The high-voltage battery obtains a high voltage in such a manner that a secondary battery (storage battery) is composed by connecting a plurality of unit cells, for example, such as nickel-hydrogen batteries and lithium batteries in series to one another.

In the secondary battery, it is necessary to confirm a charged state of each unit cell so as to avoid an overdischarged state or an overcharged state. Therefore, heretofore, a plurality (for example, fifty five) of unit cells are divided, for example, into five blocks (that is, eleven unit cells compose one block), and a voltage of each of the blocks has been measured in real time by a voltage-detecting IC provided for each of the blocks.

In this event, upon measuring the voltage of one block, each voltage-detecting IC has transmitted data through an insulating device to a main microcomputer provided in a low-voltage region (refer to JP 2009-17657 A).

Here, by referring to FIG. 1, a description is made of a conventional circuit configuration between the voltage-detecting IC and the main microcomputer. As illustrated in FIG. 1, heretofore, the respective voltage-detecting ICs provided in a high-voltage region have been connected through the insulating devices to the main microcomputer provided in the low-voltage region.

In particular, in each of the voltage-detecting ICs, there are provided terminals for individually receiving control signals for each of three functions, which are: chip selection; reset; interruption. Accordingly, it has been necessary to provide circuits for transmitting ON/OFF signals to the respective terminals.

SUMMARY OF INVENTION

In the conventional circuit configuration illustrated in FIG. 1, the circuits are required, which are for transmitting three signals for the chip selection, the reset and the interruption to each of the voltage-detecting ICs. Therefore, in the conventional circuit configuration, there has been a problem that cost is increased since 3N pieces of the circuits are required in the case where the number of the voltage-detecting ICs is N. In particular, also with regard to the relatively expensive insulating devices, 3N pieces thereof are required, and accordingly, such a cost increase has been significant.

The present invention has been proposed in consideration of the above-mentioned actual circumstances. It is an object of the present invention to provide a voltage detection device capable of realizing a cost reduction by reducing the circuits between the voltage-detecting ICs and the main microcomputer.

In order to achieve the foregoing object, a voltage detection device according to a first aspect of the present invention, which detects a voltage of a secondary battery composed by connecting a plurality of unit cells in series to one another, includes a plurality of voltage detectors and an interruption control unit. The voltage detectors are installed in a high-voltage region connected to the secondary battery, and each of the voltage detectors is installed, in order to detect a voltage of each of a plurality of blocks having the unit cells divided thereinto, for each of the blocks. The interruption control unit is installed in a low-voltage region insulated from the high-voltage region, and controls interruption operations of the voltage detectors. Then, after resetting all of the voltage detectors by transmitting a trigger signal to all of the voltage detectors, the interruption control unit transmits a control signal in which an address of a voltage detector desired to execute an interruption operation is designated among the voltage detectors. Each of the voltage detectors receives the control signal within a predetermined designated time, executes the interruption operation when an address of its own is designated, and is left reset when the address of its own is not designated.

With such a configuration, while the circuits have been heretofore required, which are for transmitting the three signals for the chip selection, the reset and the interruption, the circuits can be reduced to only that for the trigger signal line. In such a way, not only the circuits but also the insulating devices can be reduced. As a result, a large cost reduction can be realized.

Preferably, the respective voltage detectors are connected to one another in a daisy chain fashion, and one specific voltage detector is connected to the interruption control unit.

With such a configuration, such data communication lines can be reduced to one. In such a way, not only the circuits but also the insulating devices can be reduced. As a result, the large cost reduction can be realized.

Preferably, the voltage detection device according to the first aspect of the present invention further includes: a trigger signal line for transmitting the trigger signal from the interruption control unit through an insulating device to the high-voltage region, and for distributing and transmitting the trigger signal to all of the voltage detectors in the high-voltage region.

With such a configuration, such trigger signal lines can be reduced to the minimum necessary. In such a way, not only the circuits but also the insulating devices can be reduced. As a result, the large cost reduction can be realized.

BRIEF DESCRIPTION OF DRAWINGS

FIG. 3 is a flowchart illustrating a processing procedure of interruption control processing by the voltage detection device according to the embodiment of the present invention.

DESCRIPTION OF EMBODIMENTS

A description is made below of an embodiment with reference to the drawings.
(Configuration of Voltage Detection Device)

Figure 1:
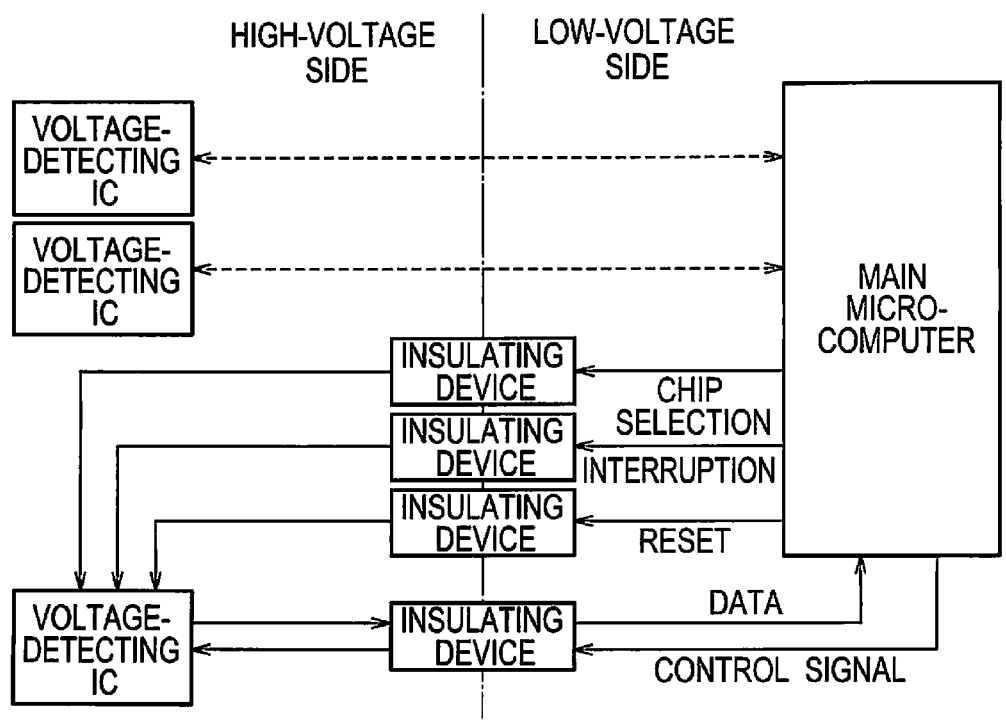
FIG. 1 is a block diagram illustrating a configuration of a conventional voltage detection device.
Figure 2:
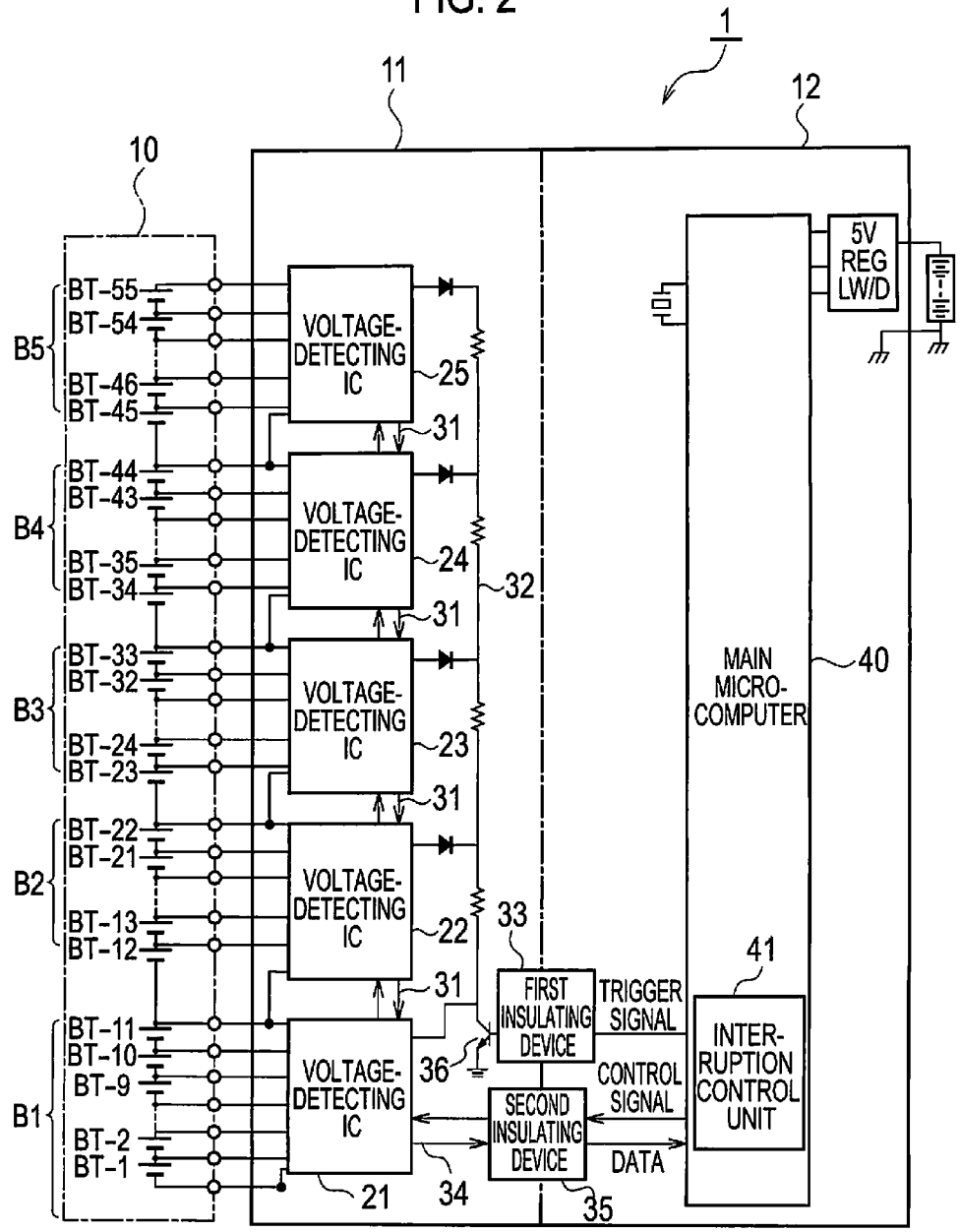
FIG. 2 is a block diagram illustrating a configuration of a voltage detection device according to an embodiment of the present invention.

As illustrated in FIG. 2, a voltage detection device 1 according to this embodiment includes: a secondary battery 10; voltage-detecting ICs (voltage detectors) 21 to 25; inter- IC communication lines 31; a trigger signal line 32; a first insulating device 33; a data communication line 34; a second insulating device 35; a main microcomputer 40; and an interruption control unit 41. The secondary battery 10 is composed of a plurality of unit cells BT1 to BT55. The voltage-detecting ICs 21 to 25 detect voltages of respective blocks as a plurality of blocks B1 to B5 into which the unit cells BT1 to BT55 are divided. The inter-IC communication lines 31 connect the respective voltage-detecting ICs 21 to 25 to one another by daisy chain connection. A trigger signal is transmitted to the trigger signal line 32. The first insulating device 33 connects a low-voltage region and high-voltage region of the trigger signal line 32 to each other. A control signal and data are transmitted to the data communication line 34. The second insulating device 35 connects a low-voltage region and high-voltage region of the data communication line 34 to each other. The main microcomputer 40 controls voltage detection by the voltage-detecting ICs 21 to 25. The interruption control unit 41 is installed in the main microcomputer 40, and controls interruption operations of the voltage-detecting ICs 21 to 25.

The voltage detection device 1 is separated into: a high-voltage region 11 connected to the secondary battery 10; and a low-voltage region 12 insulated from the high-voltage region 11. In the high-voltage region 11, the voltage-detecting ICs 21 to 25 are installed. In the low-voltage region 12, the main microcomputer 40 is installed.

In FIG. 2, as an example, the secondary battery 10 is illustrated as a secondary battery in which the fifty five unit cells BT1 to BT55 are connected in series to one another, and is divided into the five blocks B1 to B5, each of which has eleven unit cells.

In order to detect the voltages of the respective blocks B1 to B5, the voltage-detecting ICs 21 to 25 are installed for the blocks B1 to B5, respectively. The respective voltage-detecting ICs 21 to 25 are connected to one another in a daisy chain fashion by the inter-IC communication lines 31. Then, one specific voltage-detecting IC (the voltage-detecting IC 21 in FIG. 2) is connected to the main microcomputer 40 by the data communication line 34. However, it is not always necessary that the respective voltage-detecting ICs 21 to 25 be connected to one another in the daisy chain fashion, and each of the voltage-detecting ICs 21 to 25 may be connected to the main microcomputer 40 by a data communication line.

The trigger signal line 32 transmits the trigger signal from the interruption control unit 41 through the first insulating device 33 to the high-voltage region 11. In the high-voltage region 11, the trigger signal is distributed and transmitted to all of the voltage-detecting ICs 21 to 25.

At the time of a normal operation, the main microcomputer 40 transmits the control signal to the voltage-detecting ICs 21 to 25 through the data communication line 34, thereby controls the voltage detection, and receives data such as voltage values and abnormality flags, which are detected by the voltage-detecting ICs 21 to 25. Then, in the case of allowing any of the voltage-detecting ICs 21 to 25 to execute the interruption operation, the interruption control unit 41 is allowed to execute interruption control.

In the case of allowing any of the voltage-detecting ICs 21 to 25 to execute the interruption operation, the interruption control unit 41 transmits the trigger signal through the trigger signal line 32 to all of the voltage-detecting ICs 21 to 25. Then, all of the voltage-detecting ICs 21 to 25 are reset once. Thereafter, by transmitting a control signal in which an address of the voltage-detecting IC allowed to execute the interruption operation is designated, the interruption control unit 41 allows the thus designated voltage-detecting IC to execute the interruption operation, and the voltage-detecting ICs which are not designated are left reset.

(Procedure of Interruption Control Processing)

Next, a description is made of a procedure of interruption control processing by the voltage detection device 1 according to this embodiment with reference to a flowchart of FIG. 3.

In Step S101, the main microcomputer 40 is performing the normal operation such as the voltage detection. In Step S102, the main microcomputer 40 determines whether or not the interruption operation has occurred. In the case where the interruption operation has not occurred, the main microcomputer 40 returns to Step S101, and continues the normal operation.

In the case where the interruption operation has occurred in step S102, the main microcomputer 40 shifts to Step S103, where the interruption control unit 41 transmits the trigger signal. The transmitted trigger signal is transmitted to the high-voltage region 11 through the first insulating device 33, and switches ON a transistor 36. Then, the trigger signal is transmitted to all of the voltage-detecting ICs 21 to 25 connected to the transistor 36. In Step S104, the voltage-detecting ICs 21 to 25 which have received the trigger signal stop operations thereof, and are reset. That is to say, at this point of time, all of the voltage-detecting ICs 21 to 25 are in a state of being reset. Here, such a reset state refers to a state where the voltage-detecting ICs 21 to 25 stop the operations and shift to a low current consumption mode. When all of the voltage-detecting ICs 21 to 25 are reset in such a way, then in Step S105, the interruption control unit 41 transmits the control signal through the data communication line 34. The control signal is transmitted to the high-voltage region 11 through the second insulating device 35, and is transmitted to the voltage-detecting IC 21. Thereafter, by the inter-IC communication lines 31, the control signal is sequentially transmitted from the voltage-detecting IC 22 to the voltage-detecting IC 25. At this time, in the control signal, the address of the voltage-detecting IC allowed to execute the interruption operation is designated. Then, in Step S106, each of the voltage-detecting ICs 21 to 25 determines whether or not to have received such a control signal, in which an address of its own is designated, within a designated time set in advance. The voltage-detecting IC of which address is not designated continues the reset state in Step S107. The voltage-detecting IC of which address is designated starts the interruption operation in Step S108.

Here, in the case of resetting all of the voltage-detecting ICs 21 to 25, a control signal in which the address is not designated may be transmitted, or alternatively, the control signal itself does not have to be transmitted.

In such a way, each of the voltage-detecting ICs 21 to 25 turns to such an interruption operation state or the reset state. Thereafter, in Step S109, the interruption control unit 41 determines whether or not to return the voltage-detecting ICs 21 to 25 to the normal operation. In the case of allowing the voltage-detecting ICs 21 to 25 to continue the reset state or the interruption operation, the main microcomputer 40 returns to Steps S107 and S108, and allows the voltage-detecting ICs 21 to 25 to continue the reset state or the interruption operation. In the case of returning the voltage-detecting ICs 21 to 25 to the normal operation because of the end of the interruption operation, the main microcomputer 40 shifts to Step S110, and returns the voltage-detecting ICs 21 to 25 to the normal operation. In such a manner as described above, the interruption control processing by the voltage detection device 1 according to this embodiment is ended.

(Effects of Embodiment)

As described above in detail, in accordance with the voltage detection device 1 according to the embodiment, all of the voltage-detecting ICs 21 to 25 are reset by the trigger signal, and each of the voltage-detecting ICs 21 to 25 is allowed to execute the interruption operation by the control signal in which the address of the voltage-detecting IC allowed to execute the interruption operation is designated. Therefore, while the circuits have been heretofore required, which are for transmitting the three signals for the chip selection, the reset and the interruption, the circuits can be reduced to only that for the trigger signal line in the voltage detection device 1 according to this embodiment. In such a way, not only the circuits but also the insulating devices can be reduced. As a result, a large cost reduction can be realized.

Moreover, in accordance with the voltage detection device 1 according to this embodiment, the voltage-detecting ICs 21 to 25 are connected to one another in the daisy chain fashion, and only the one specific voltage-detecting IC 21 is connected to the main microcomputer 40. Therefore, such data communication lines 34 can be reduced to one. In such a way, not only the circuits but also the insulating devices can be reduced. As a result, the large cost reduction can be realized. Furthermore, in accordance with the voltage detection device 1 according to this embodiment, the trigger signal is transmitted to the high-voltage region through the one insulating device, and the trigger signal is distributed to all of the voltage-detecting ICs 21 to 25 in the high-voltage region. Therefore, such trigger signal lines 32 can be reduced to the minimum necessary. In such a way, not only the circuits but also the insulating devices can be reduced. As a result, the large cost reduction can be realized.

Note that the above-mentioned embodiment is an example of the present invention. The present invention is not limited to the above-mentioned embodiment, and even in embodiments other than this embodiment, a variety of modifications are possible in response to a design and the like within the scope without departing from the technical ideas according to the present invention.

What is claimed is:

1. A voltage detection device for detecting a voltage of a secondary battery composed by connecting a plurality of unit cells in series to one another, the voltage detection device comprising:

a plurality of voltage detectors installed in a high-voltage region connected to the secondary battery, each of the voltage detectors being installed, in order to detect a voltage of each of a plurality of blocks having the unit cells divided thereinto, for each of the blocks; and a main microcomputer including an interruption control unit for controlling interruption operations of the voltage detectors, the interruption control unit being installed in a low-voltage region insulated from the high-voltage region, wherein a trigger signal line transmits a trigger signal from the interruption control unit through an insulating device to the high-voltage region, and distributes and transmits the trigger signal to all of the voltage detectors in the high-voltage region to thereby cause all of the voltage detectors to be shifted to a reset state as a low current mode, after all of the voltage detectors have been shifted to the reset state by transmitting the trigger signal to all of the voltage detectors via the trigger signal line, the interruption control unit transmits a control signal in which an address of a specific voltage detector desired to execute an interruption operation is designated among the voltage detectors, and each of the voltage detectors receives the control signal within a predetermined designated time, executes the interruption operation when an address of its own is designated, and is left in the reset state when the address of its own is not designated.

2. The voltage detection device according to claim 1, wherein the respective voltage detectors are connected to one another in a daisy chain fashion, and one specific voltage detector is connected to the interruption control unit.

3. The voltage detection device according to claim 1, wherein the predetermined designated time is set in advance.

4. The voltage detection device according to claim 1, further comprising a transistor provided on the trigger signal line, wherein the transistor acts to send the trigger signal to each of the voltage detectors when the trigger signal is provided on the trigger signal line.

* * * * *